(12) United States Patent
Migiyama et al.

(10) Patent No.: US 11,942,346 B2
(45) Date of Patent: Mar. 26, 2024

(54) RESIN APPLYING MACHINE

(71) Applicant: DISCO CORPORATION, Tokyo (JP)

(72) Inventors: Yoshikuni Migiyama, Tokyo (JP); Kazuki Sugiura, Tokyo (JP); Yoshinori Kakinuma, Tokyo (JP); Mitsuru Ikushima, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 925 days.

(21) Appl. No.: 16/928,432

(22) Filed: Jul. 14, 2020

(65) Prior Publication Data

US 2021/0028026 A1 Jan. 28, 2021

(30) Foreign Application Priority Data

Jul. 23, 2019 (JP) .................................. 2019-135644

(51) Int. Cl.
| | |
|---|---|
| *H01L 21/67* | (2006.01) |
| *B05C 11/10* | (2006.01) |
| *H01L 21/673* | (2006.01) |
| *H01L 21/677* | (2006.01) |
| *H01L 21/683* | (2006.01) |

(52) U.S. Cl.
CPC ........ *H01L 21/673* (2013.01); *B05C 11/1005* (2013.01); *B05C 11/1015* (2013.01); *H01L 21/67248* (2013.01); *H01L 21/6776* (2013.01); *H01L 21/6835* (2013.01)

(58) Field of Classification Search
USPC ....... 118/665, 666, 667, 712, 321, 323, 305, 118/641–643, 500, 686, 687
See application file for complete search history.

(56) References Cited

U.S. PATENT DOCUMENTS

| 9,439,335 B2 * | 9/2016 | Maeda | ............... H05K 13/0469 |
| 2004/0023439 A1 * | 2/2004 | Kimino | ............... H01L 21/6715 438/126 |

FOREIGN PATENT DOCUMENTS

| CN | 101065616 A | * 10/2007 | ....... H01L 21/67248 |
| JP | 2017168565 A | 9/2017 | |

OTHER PUBLICATIONS

English Translation JP2017168565A (Year: 2017).*
English Translation Description CN-101065616-A (Year: 2007).*

* cited by examiner

*Primary Examiner* — Yewebdar T Tadesse
(74) *Attorney, Agent, or Firm* — Greer, Burns & Crain, Ltd.

(57) ABSTRACT

A resin applying machine includes a processing chamber, a temperature measuring unit, and a controller. The processing chamber houses therein a holder for holding the wafer, a table that faces the holder, a resin supply unit for supplying a liquid resin to the table, a moving unit for relatively moving the holder and the table closely to each other, and a hardening unit for hardening the liquid resin that has coated the wafer. The temperature measuring unit measures a temperature in the processing chamber. The controller includes a correlation data storage unit for recording therein correlation data with respect to the temperature in the processing chamber and a moved distance by which the holder and the table are relatively moved by the moving unit at the temperature.

3 Claims, 7 Drawing Sheets

RESIN APPLYING MACHINE

BACKGROUND OF THE INVENTION

Field of the Invention

The present invention relates to a resin applying machine for coating one surface of a wafer with a resin.

Description of the Related Art

There is known a technology in which a holder holding a wafer and a table supplied with a liquid resin are brought closely to each other to coat one surface of the wafer with the resin (see Japanese Patent Laid-Open No. 2017-168565).

SUMMARY OF THE INVENTION

In a case where a bumpy surface of a wafer with bumps is coated with a resin to make the surface irregularities even and the opposite surface of the wafer is cut or ground, if the resin layer is not of a constant thickness, the wafer tends to be cut to varying depths or ground to different thicknesses. In a resin applying machine, it is the usual practice to harden a liquid resin after it has coated a wafer. Therefore, the heat generated by hardening the liquid resin tends to be trapped inside the resin applying machine, making a holder and a table expand in the resin applying machine. Furthermore, a predetermined fixed value is given to indicate how close the holder and the table should be to each other in coating the wafer with the resin. Since the holder and the table are expanded and contracted depending on the temperature, the distance between the holder and the table actually varies depending on the temperature, resulting in a different amount of liquid resin pushed onto the wafer and failing to coat the wafer to a uniform thickness with the resin.

It is therefore an object of the present invention to provide a resin applying machine which is capable of reducing variations of the thickness of a resin with which to coat a wafer.

In accordance with an aspect of the present invention, there is provided a resin applying machine for coating a surface of a wafer with a resin to a desired thickness including a processing chamber, a temperature measuring unit, and a controller. The processing chamber houses therein a holder for holding the wafer, a table that faces the holder, a resin supply unit for supplying a liquid resin to the table, a moving unit for relatively moving the holder and the table closely to each other, and a hardening unit for hardening the liquid resin that has coated the wafer. The temperature measuring unit measures a temperature in the processing chamber. The controller controls the moving unit and the temperature measuring unit. The controller includes a correlation data storage unit for recording therein correlation data with respect to the temperature in the processing chamber and a moved distance by which the holder and the table are relatively moved by the moving unit at the temperature, as data for making the resin thickness of the resin that has coated the wafer constant even at different temperatures in the processing chamber, the data being acquired on the basis of measured resin thicknesses of the resin that has coated the wafer when the moving unit has relatively moved the holder and the table by the same moved distance at different temperatures in the processing chamber. The controller sets the moved distance corresponding to the temperature measured by the temperature measuring unit in the moving unit by referring to the correlation data and coats the wafer with the resin to a predetermined resin thickness.

The temperature measuring unit may measure the temperature of either one of the holder and the table.

The temperature measuring unit may measure the temperatures of the holder and the table and use an average thereof as a temperature in the processing chamber of the resin applying machine.

According to an aspect of the present invention, it is possible to reduce variations of the thickness of the resin that has coated the wafer.

The above and other objects, features and advantages of the present invention and the manner of realizing them will become more apparent, and the invention itself will best be understood from a study of the following description and appended claims with reference to the attached drawings showing preferred embodiments of the invention.

DETAILED DESCRIPTION OF THE PREFERRED EMBODIMENTS

Modes for carrying out the present invention, i.e., embodiments of the present invention, will hereinafter be described in detail with reference to the drawings. The present invention is not limited to the details of the embodiments described below. The components described below cover those which could easily be anticipated by those skilled in the art and those which are essentially identical thereto. Furthermore, the arrangements described below can be used in appropriate combinations. Various omissions, replacements, or changes of the arrangements may be made without departing from the scope of the present invention.

First Embodiment

Figure 1:
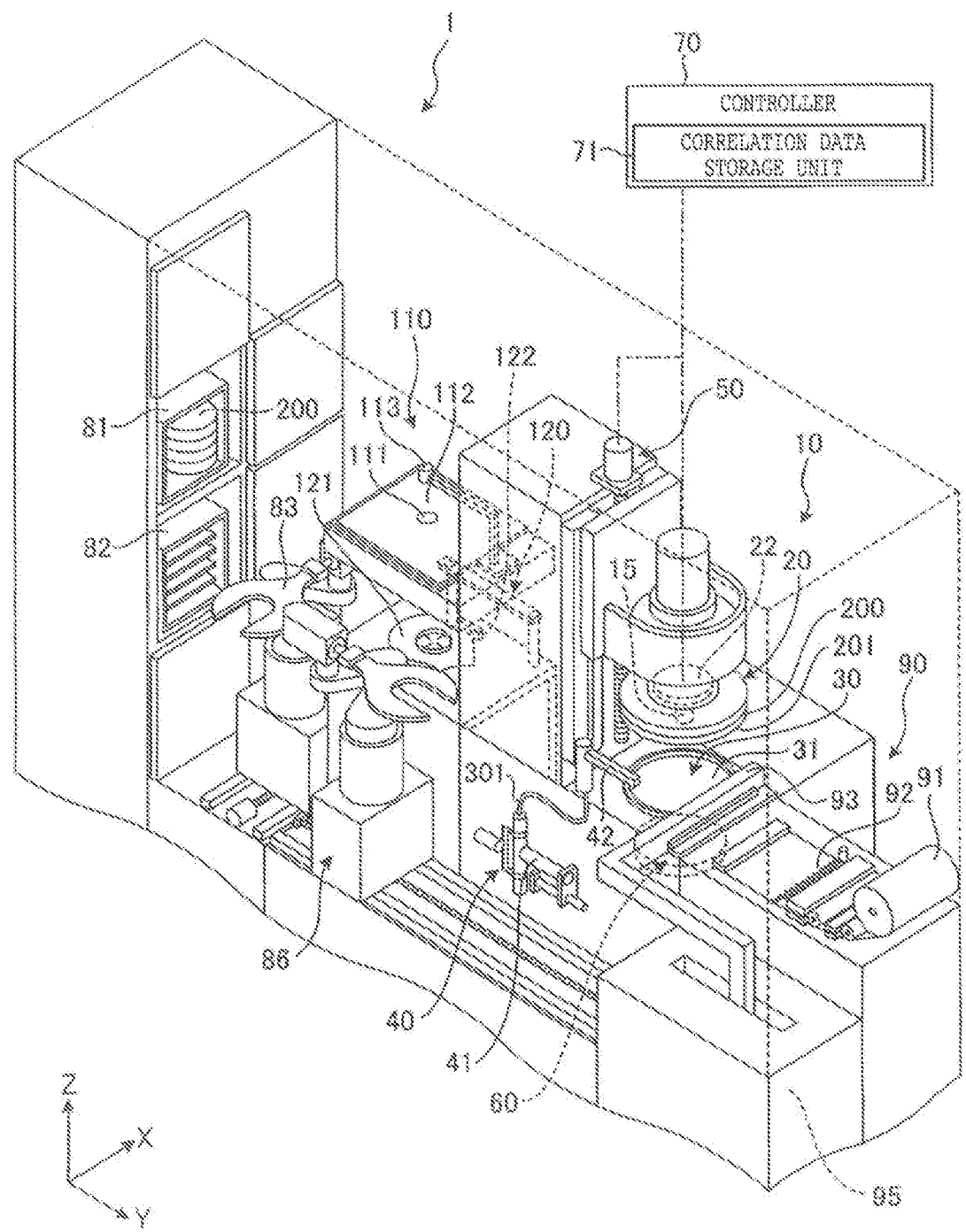
FIG. 1 is a perspective view illustrating a structural example of a resin applying machine according to a first embodiment of the present invention.

A resin applying machine 1 according to a first embodiment of the present invention will be described below with reference to the drawings. FIG. 1 illustrates in perspective a structural example of the resin applying machine 1 according to the first embodiment. The resin applying machine 1 is an apparatus for coating a face side 201 that is one surface of a wafer 200 with a resin 302 (see FIGS. 9 and 10).

According to the first embodiment, the wafer 200, which is an object to be coated with the resin 302 by the resin applying machine 1, is a semiconductor wafer, an optical device wafer, or the like that is shaped as a circular plate made of a base material such as silicon, sapphire, or gallium arsenide, for example. Since the wafer 200 is also an object to be processed according to the first embodiment on the resin applying machine 1, the wafer 200 is also referred to as "workpiece." The wafer 200 includes a device area 202 (see FIG. 3) where devices are formed on the face side 201 and an outer circumferential excess area 203 (see FIG. 3) surrounding the device area 202.

Plural bumps 204 (see FIG. 3) having a function as electrodes are disposed on face sides of devices formed on the face side 201 of the wafer 200 within the device area 202. The bumps 204 protrude from the face sides of the devices. The devices have surface irregularities on their face sides because of the bumps 204 thereon. The wafer 200 has a flat reverse side 205 (see FIG. 3) opposite the face side 201 thereof.

As the devices on the wafer 200 have surface irregularities on their face sides because of the bumps 204 thereon, the resin applying machine 1 according to the first embodiment is highly advantageous when applied to the wafer 200. However, the present invention is not limited to such an application, but may be applied to a packaged substrate having surface irregularities in which devices and wires connected to the devices by wire bonding are sealed by a sealant made of a molding resin, a wafer having no surface irregularities, a packaged substrate having no surface irregularities, or an as-sliced wafer before devices are formed thereon.

As illustrated in FIG. 1, the resin applying machine 1 includes a processing chamber 10, a temperature measuring unit 15 for measuring the temperature in the processing chamber 10, and a controller 70 for controlling the members and mechanisms of the resin applying machine 1. The processing chamber 10 of the resin applying machine 1 includes a holder 20 for holding the wafer 200, a table 30 disposed in facing relation to the holder 20, a resin supply unit 40 for supplying a liquid resin 301 to the table 30, a moving unit 50 for moving the holder 20 and the table 30 relatively closely to each other to coat the wafer 200 with the liquid resin 301, and a hardening unit 60 for hardening the liquid resin 301 applied to the wafer 200.

The holder 20 holds the wafer 200 on a lower end thereof under suction forces applied to the wafer 200 from above. The holder 20 is vertically movably supported on the moving unit 50. The holder 20 includes a pressing force measuring unit 22 disposed vertically above the position where the wafer 200 is held, i.e., the lower end of the holder 20. The pressing force measuring unit 22 is capable of measuring a pressing force applied downwardly through the holder 20. Specifically, the pressing force measuring unit 22 can measure a pressing force applied when the holder 20 spreads the liquid resin 301.

The table 30 has a holding surface 31 that is slightly larger in diameter than the diameter of the wafer 200. The table 30 holds on the holding surface 31 thereof a sheet 92 supplied from a sheet supply unit 90 to be described later. The liquid resin 301 supplied from the resin supply unit 40 is supplied to the sheet 92 held on the holding surface 31. A hardening unit 60 is disposed vertically below the table 30, which is integrally combined with the hardening unit 60. The hardening unit 60 hardens the liquid resin 301 supplied to the sheet 92 through the sheet 92 held on the holding surface 31.

The resin supply unit 40 includes a resin supply source 41 as a source for supplying the liquid resin 301 and a nozzle 42 for ejecting the liquid resin 301 from the resin supply source 41 toward the holding surface 31 of the table 30. According to the first embodiment, the liquid resin 301 supplied from the resin supply unit 40 should preferably have a viscosity in the range of 0.5 to 400 Pa·s.

According to the first embodiment, the liquid resin 301 supplied from the resin supply unit 40 is an ultraviolet-curable resin. However, the present invention is not limited to such details. The liquid resin 301 may instead be a thermosetting resin. In a case where the liquid resin 301 supplied from the resin supply unit 40 is an ultraviolet-curable resin, it is made up of an ultraviolet-curable resin component and a binder polymer component such as acrylic polymer. In a case where the liquid resin 301 supplied from the resin supply unit 40 is a thermosetting resin, it is made up of a thermosetting resin component such as an epoxy resin or a phenolic resin and a binder polymer component such as acrylic polymer. The liquid resin 301 supplied from the resin supply unit 40 may alternatively be a mixture of ultraviolet-curable resin and thermosetting resin.

Figure 9:
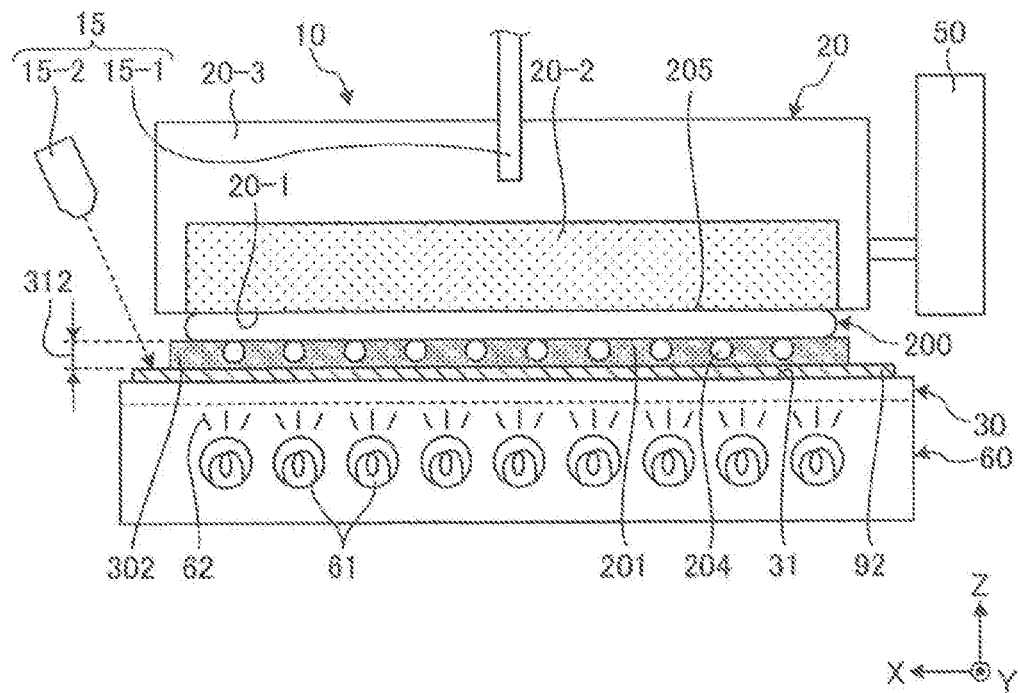
FIG. 9 is a cross-sectional view of essential details of a hardening operation of the resin applying machine illustrated in FIG. 1.

According to the first embodiment, inasmuch as the liquid resin 301 is an ultraviolet-curable resin, the hardening unit 60 includes a plurality of ultraviolet ray emission sections 61 (see FIG. 2, etc.) arrayed in a horizontal array for emitting ultraviolet rays 62 (see FIG. 9). The ultraviolet ray emission sections 61 may be ultraviolet light-emitting diodes (LEDs), for example. Therefore, the table 30 and the sheet 92, to be described later, are made of materials capable of transmitting therethrough at least part of the ultraviolet rays 62. For example, the table 30 may be made of glass transparent to ultraviolet rays. However, the present invention is not limited to such details. The liquid resin 301 may be a thermosetting resin, the hardening unit 60 may be a heater, and the table 30 and the sheet 92 may be made of a material that is sufficiently thermally conductive.

The controller 70 controls the members and mechanisms of the resin applying machine 1 to enable the resin applying machine 1 to perform various operations. The controller 70 is a computer including an arithmetic processing apparatus having a microprocessor such as a central processing unit (CPU), a storage apparatus having a memory such as a read only memory (ROM) or a random access memory (RAM), and an input/output interface apparatus. The arithmetic processing apparatus of the controller 70 carries out arithmetic processing operations according to computer programs stored in the storage apparatus to output control signals for controlling the resin applying machine 1 through the input/output interface apparatus to the members and mechanisms of the resin applying machine 1.

The controller 70 includes a correlation data storage unit 71. The function of the correlation data storage unit 71 is realized when the storage apparatus of the controller 70 records predetermined correlation data 73 (see FIG. 7) therein. The correlation data 73 will be described later.

As illustrated in FIG. 1, the resin applying machine 1 further includes a pair of cassettes 81 and 82, a loading/unloading unit 83, and a delivery unit 86. Each of the cassettes 81 and 82 is constructed as a housing for accommodating wafers 200, the housing having a plurality of slots for receiving the respective wafers 200 therein. The cassette 81 accommodates therein wafers 200 to be processed by the resin applying machine 1, whereas the cassette 82 accommodates therein wafers 200 that have been processed by the resin applying machine 1.

The loading/unloading unit 83 unloads a wafer 200 to be processed from the cassette 81 onto a temporary rest base 111 of a wafer detecting unit 110 and loads a processed wafer 200 from an excess portion removing unit 120, to be described later, into the cassette 82.

The delivery unit 86 delivers a wafer 200, whose diameter have been measured by the wafer detecting unit 110 and whose center and orientation have been aligned by the wafer detecting unit 110, from the temporary rest base 111 to the holder 20, and delivers a wafer 200, whose face side 201 has been coated with the resin 302, from the holder 20 to the excess portion removing unit 120.

As illustrated in FIG. 1, the resin applying machine 1 further includes the sheet supply unit 90. The sheet supply unit 90 pulls out a sheet 92 from a sheet roll 91 where the sheet 92 with both surfaces being flat is wound in a roll, and cuts the sheet 92 into a predetermined length. The sheet 92 of the cut length is attracted and held under suction by attracting members 94 (see FIG. 2) disposed vertically beneath a sheet delivery unit 93, and is then delivered onto the holding surface 31 of the table 30 by the sheet delivery unit 93 that is actuated by an actuator 95. According to the first embodiment, the sheet 92 is slightly larger than the holding surface 31 of the table 30. According to the first embodiment, the sheet 92 is made of a material capable of transmitting therethrough at least part of the ultraviolet rays 62. For example, the sheet 92 may be made of polyolefin (PO), polyethylene terephthalate (PET), or the like.

As illustrated in FIG. 1, the resin applying machine 1 further includes a wafer detecting unit 110. As illustrated in FIG. 1, the wafer detecting unit 110 includes a temporary rest base 111, an illuminating unit 112, and an image capturing unit 113. The illuminating unit 112 is disposed below the temporary rest base 111 in the thicknesswise directions of the wafer 200, and extends horizontally in radial directions of the wafer 200. The illuminating unit 112 emits illuminating light toward the wafer 200 that is placed on the temporary rest base 111 thereabove. The image capturing unit 113 is disposed above the center of the temporary rest base 111 in the thicknesswise directions of the wafer 200, and faces downwardly. The image capturing unit 113 captures an image of the wafer 200 that is placed on the temporary rest base 111, and detects illuminating light emitted from the illuminating unit 112. The image capturing unit 113 detects the center of the wafer 200 from the captured image of the wafer 200, and also detects the radial shape of the wafer 200 from the detected illuminating light emitted from the illuminating unit 112.

The wafer detecting unit 110 can measure the wafer diameter that represents the radial size of the wafer 200 on the basis of the detected radial shape of the wafer 200 from the image capturing unit 113. Furthermore, the wafer detecting unit 110 aligns the center of the wafer 200 and aligns the orientation of the wafer 200 on the basis of the detected center of the wafer 200 and the detected radial shape of the wafer 200 from the image capturing unit 113.

As illustrated in FIG. 1, the resin applying machine 1 further includes an excess portion removing unit 120. The excess portion removing unit 120 has a holding table 121 for holding a wafer 200 whose face side 201 has been coated with the resin 302, and a cutter 122 for cutting off an excess portion, which protrudes radially outwardly from the outer edge of the wafer 200, of the resin 302 that has coated the face side 201 of the wafer 200 held on the holding table 121.

Figure 2:
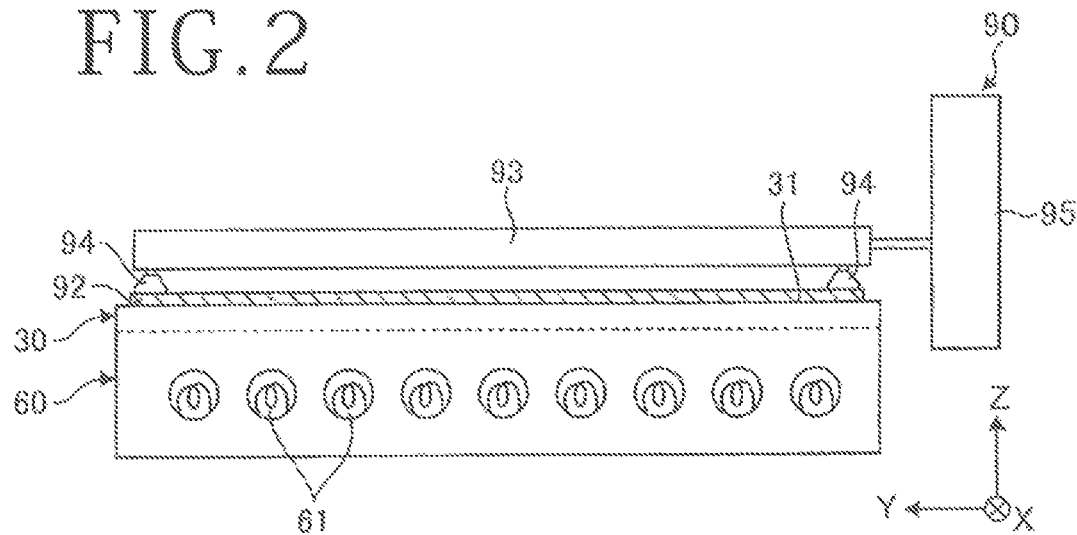
FIG. 2 is a cross-sectional view of essential details of a sheet placing operation of the resin applying machine illustrated in FIG. 1.
Figure 3:
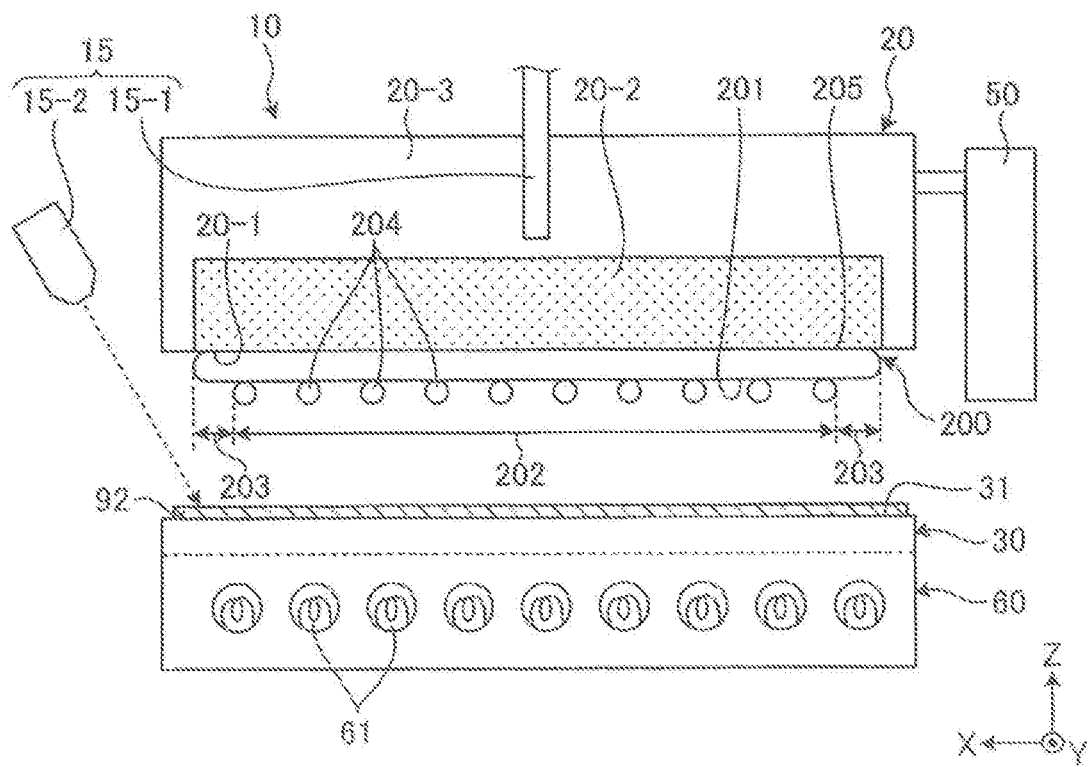
FIG. 3 is a cross-sectional view of essential details of a wafer holding operation of the resin applying machine illustrated in FIG. 1.
Figure 4:
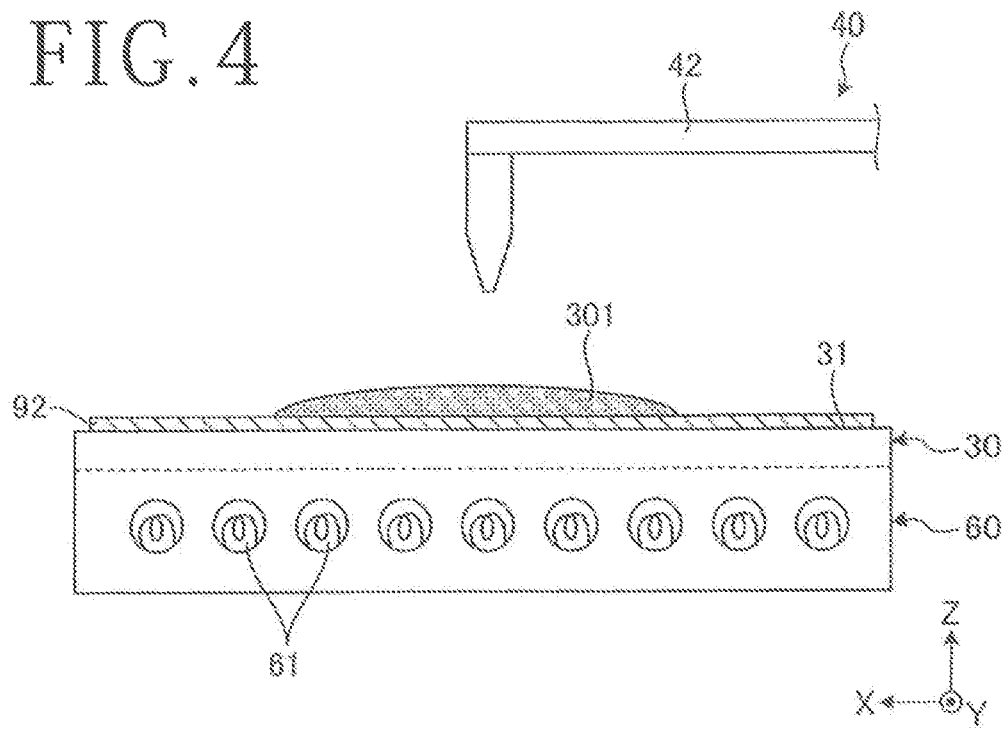
FIG. 4 is a cross-sectional view of essential details of a resin supplying operation of the resin applying machine illustrated in FIG. 1.
Figure 5:
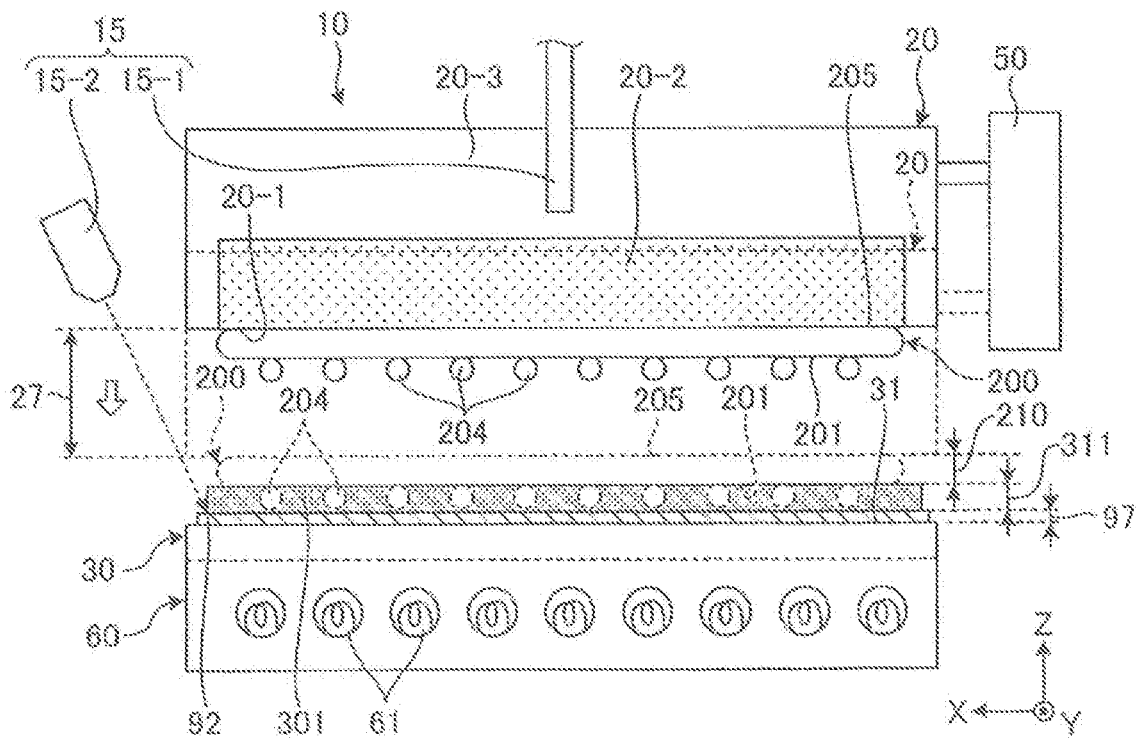
FIG. 5 is a cross-sectional view illustrating a moved distance in the resin applying machine illustrated in FIG. 1.
Figure 6:
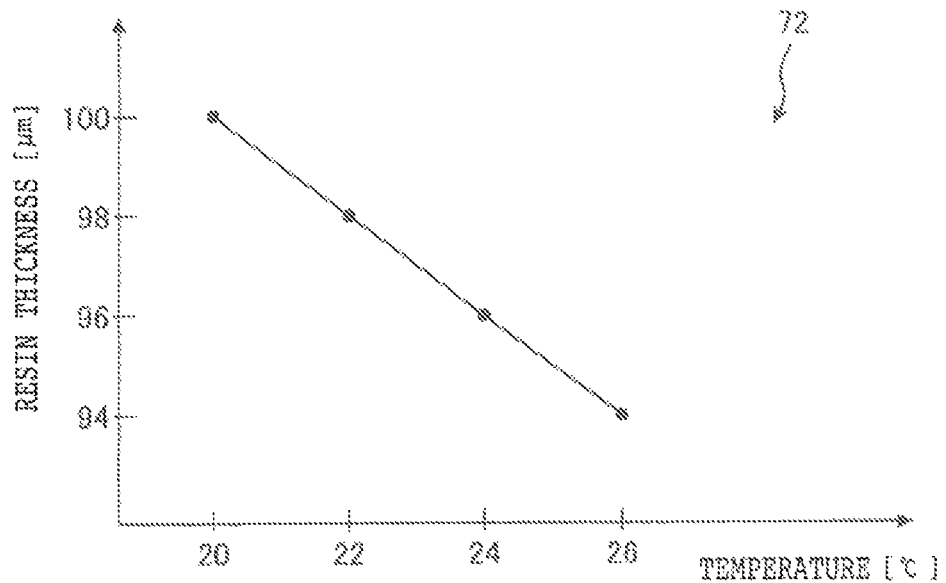
FIG. 6 is a graph illustrating a correlation between a temperature in a processing chamber and a resin thickness of a resin at a predetermined moved distance in the resin applying machine illustrated in FIG. 1.
Figure 7:
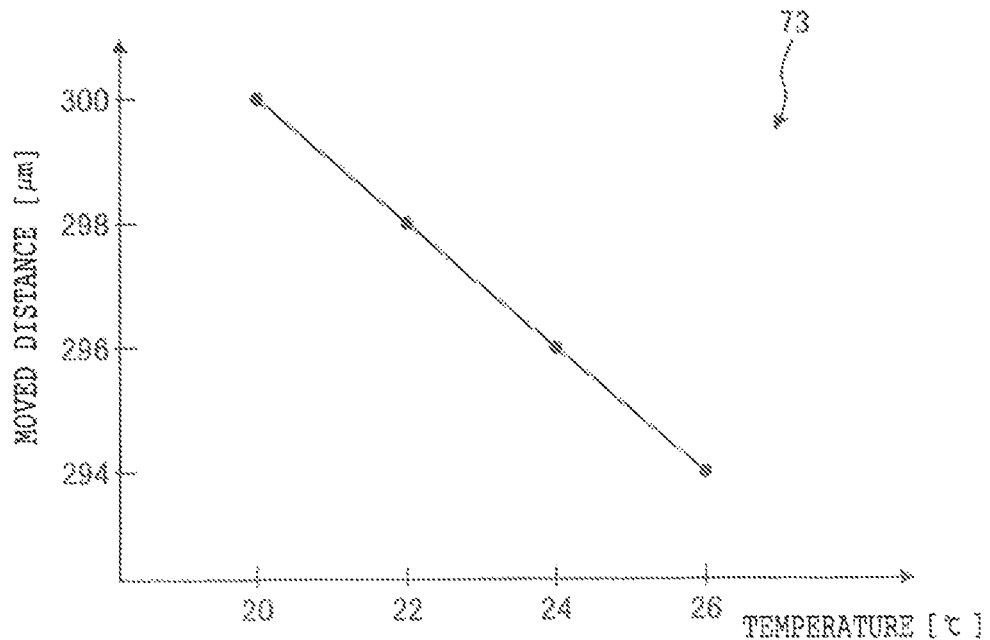
FIG. 7 is a graph illustrating a correlation between a temperature in the processing chamber and the moved distance in a case where a wafer is coated with a resin to a predetermined resin thickness in the resin applying machine illustrated in FIG. 1.
Figure 8A:
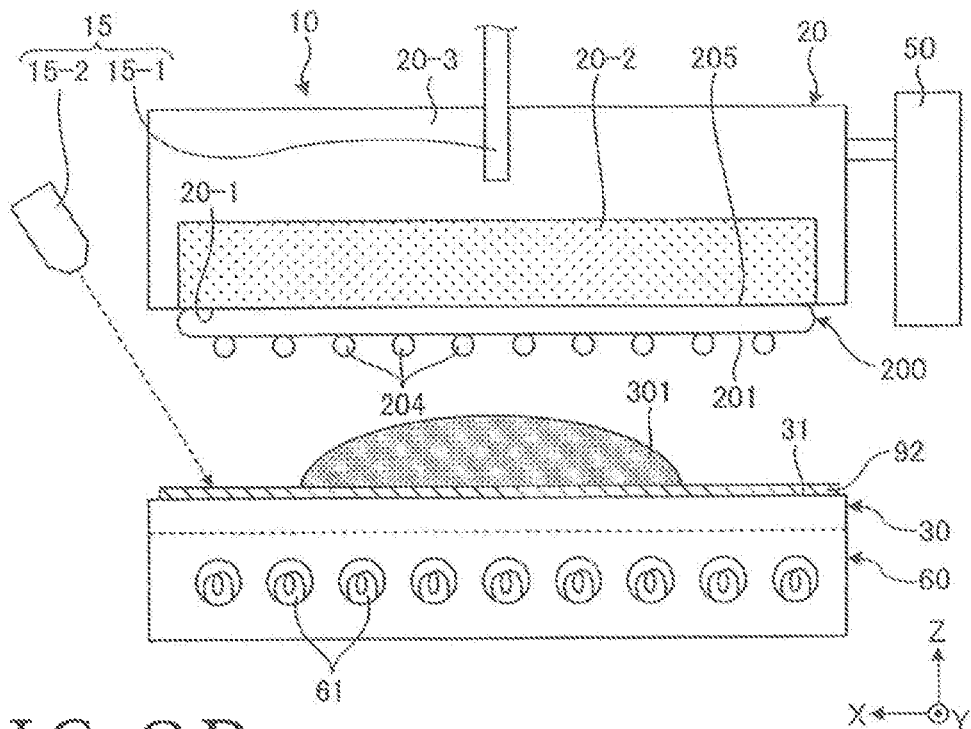
FIGS. 8A and 8B are cross-sectional views of essential details of a resin applying operation of the resin applying machine illustrated in FIG. 1.
Figure 8B:
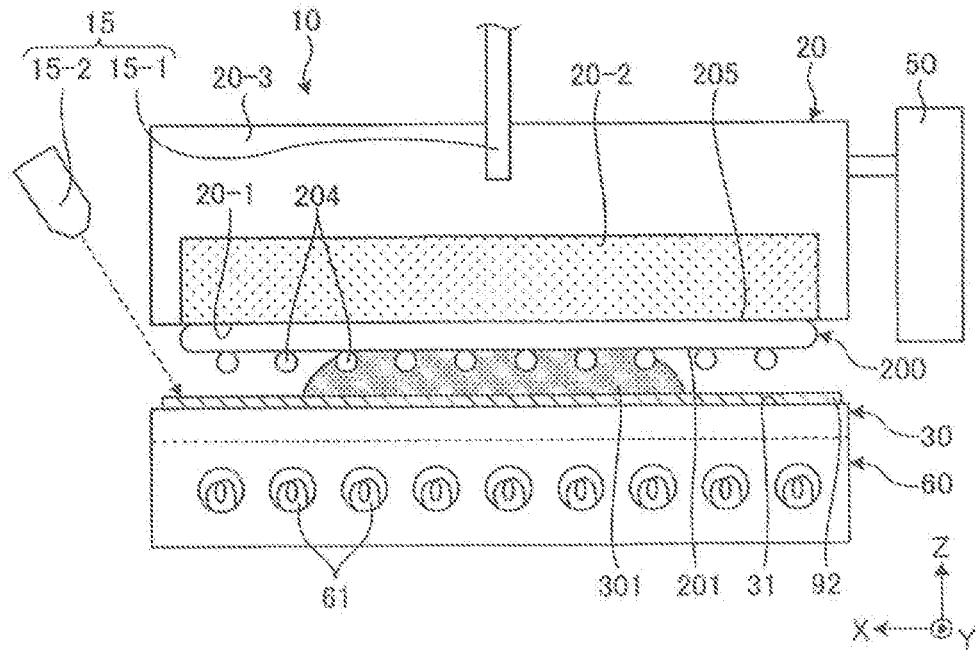
Figure 10:
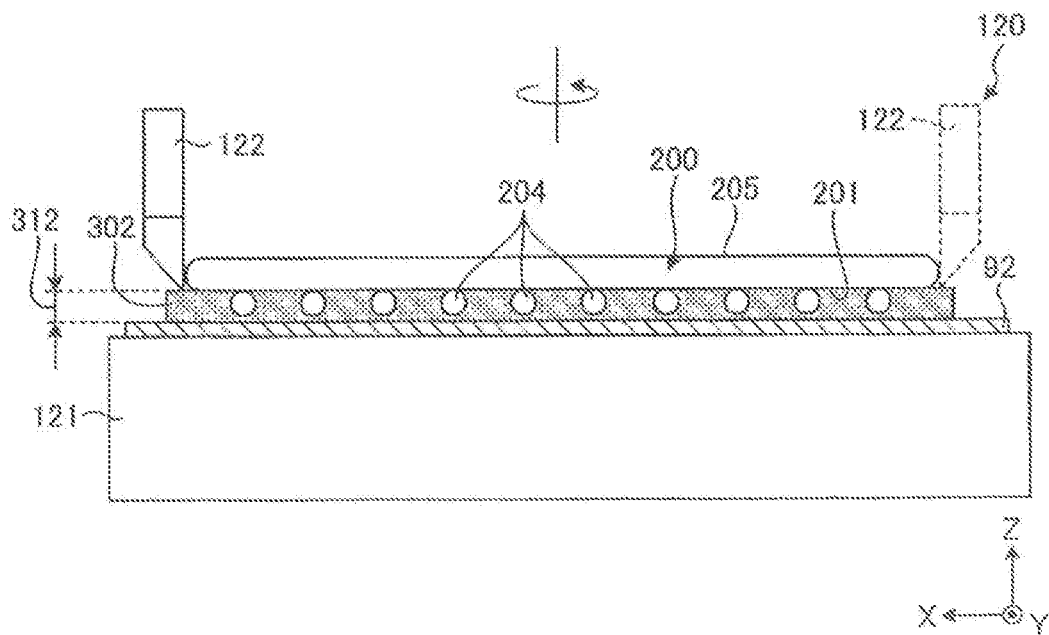
FIG. 10 is a cross-sectional view of essential details of an excess portion removing operation of the resin applying machine illustrated in FIG. 1.

Operation of the resin applying machine 1 according to the first embodiment will be described below. FIG. 2 illustrates in cross section essential details of a sheet placing operation of the resin applying machine 1 illustrated in FIG. 1. FIG. 3 illustrates in cross section essential details of a wafer holding operation of the resin applying machine 1 illustrated in FIG. 1. FIG. 4 illustrates in cross section essential details of a resin supplying operation of the resin applying machine 1 illustrated in FIG. 1. FIG. 5 is a cross-sectional view illustrating a moved distance 27 in the resin applying machine 1 illustrated in FIG. 1. FIG. 6 is a graph illustrating a correlation between a temperature in a processing chamber 10 and the resin thickness 312 of a resin 302 to be applied at a predetermined moved distance 27 in the resin applying machine 1 illustrated in FIG. 1. FIG. 7 is a graph illustrating a correlation between a temperature in the processing chamber 10 and the moved distance 27 in a case where a wafer is coated with the resin 302 to a predetermined resin thickness 312 in the resin applying machine 1 illustrated in FIG. 1. FIGS. 8A and 8B illustrate in cross section essential details of a resin applying operation of the resin applying machine 1 illustrated in FIG. 1. FIG. 8A illustrates the components before the holder 20 and the table 30 are moved closely to each other, and FIG. 8B illustrates the components after the holder 20 and the table 30 have been moved closely to each other. FIG. 9 illustrates in cross section essential details of a hardening operation of the resin applying machine 1 illustrated in FIG. 1. FIG. 10 illustrates in cross section essential details of an excess portion removing operation of the resin applying machine 1 illustrated in FIG. 1.

As illustrated in FIG. 2, the resin applying machine 1 performs a sheet placing operation in which the sheet supply unit 90 supplies the sheet 92 onto the holding surface 31 of the table 30. Though the sheet placing operation may be omitted from a sequence of operations of the resin applying machine 1 to coat the face side 201 of the wafer 200 with the resin 302, it should preferably be performed because the sheet 92 can prevent the liquid resin 301 from smearing or otherwise damaging the holding surface 31 of the table 30 when the liquid resin 301 is supplied to holding surface 31 of the table 30.

As illustrated in FIG. 3, the resin applying machine 1 performs a wafer holding operation in which the holder 20 holds the wafer 200. As illustrated in FIG. 3, the holder 20 includes an attracting member 20-2 having a flat holding surface 20-1 as its lower surface and a frame 20-3 supporting the attracting member 20-2 securely fitted in a cavity defined centrally in the frame 20-3 and opening downwardly. The attracting member 20-2 is of a disk shape and made of porous ceramics or the like having a number of pores therein. The attracting member 20-2 is connected to a vacuum suction source, not illustrated, through a vacuum suction channel, not illustrated. The holding surface 20-1 in its entirety holds the wafer 200 thereon under suction forces generated by the vacuum suction source and acting through the vacuum suction channel on the holding surface 20-1.

In the wafer holding operation, the moving unit 50 keeps the holding surface 20-1 of the holder 20 sufficiently spaced from the holding surface 31 of the table 30. Then, in the wafer holding operation, the delivery unit 86 delivers the wafer 200, whose wafer diameter has been measured and whose center and orientation have been aligned by the wafer detecting unit 110, with the reverse side 205 facing vertically upwardly to a position below the holding surface 20-1 of the holder 20. In the wafer holding operation, the holder 20 draws the upwardly facing reverse side 205 of the wafer 200 delivered to the position below the holding surface 20-1, under suction onto the holding surface 20-1. In the wafer holding operation, therefore, the holder 20 holds the wafer 200 under suction on the holding surface 20-1 while the face side 201 with the bumps 204 is facing the holding surface 31 of the table 30 disposed therebelow, as illustrated in FIG. 3.

As illustrated in FIG. 4, the resin applying machine 1 performs a resin supplying operation in which the resin supply unit 40 supplies the liquid resin 301 to the table 30 that faces the holder 20.

In the resin supplying operation, specifically, the controller 70 calculates an appropriate amount of the liquid resin 301 to be supplied on the basis of the wafer diameter obtained by the wafer detecting unit 110 and a desired resin thickness 311 (see FIG. 5) for the liquid resin 301 with which to coat the face side 201 of the wafer 200. The desired resin thickness 311 for the liquid resin 301 is calculated on the basis of a desired resin thickness 312 (see FIG. 9) for the resin 302 with which to coat the face side 201 of the wafer 200 and a shrinkage factor at which the liquid resin 301 is hardened into the resin 302.

In the resin supplying operation, next, the resin supply unit 40 moves the tip end of the nozzle 42 from a retracted position away from the holding surface 31 of the table 30 to a supply position disposed above and facing the holding surface 31 of the table 30. In the resin supplying operation, thereafter, the resin supply unit 40 supplies the appropriate amount of the liquid resin 301 calculated by the controller 70 from the nozzle 42 to the holding surface 31 of the table 30 on which the sheet 92 has been placed in the sheet placing operation.

In the resin applying machine 1 according to the first embodiment, the sheet placing operation, the wafer holding operation, and the resin supplying operation may not necessarily be carried out in the order named. In the resin applying machine 1 according to the first embodiment, specifically, the resin supplying operation may be carried out after the sheet placing operation, and the wafer holding operation as a processing operation on the wafer 200 and the sheet placing operation and the resin supplying operation as a series of processing operations on the table 30 may be carried out in any sequence or concurrent with each other. A resin applying operation to be described below is carried out after all the processing operations including the sheet placing operation, the wafer holding operation, and the resin supplying operation have been carried out.

The resin applying machine 1 performs a resin applying operation in which the moving unit 50 relatively moves the holder 20 and the table 30 closely to each other to coat the wafer 200 with the liquid resin 301, as illustrated in FIGS. 8A and 8B. In the resin applying operation, as illustrated in FIG. 5, the controller 70 sets, in the moving unit 50, a moved distance 27 by which the holder 20 and the table 30 are to be relatively moved, i.e., a relatively moved distance 27, corresponding to the temperature measured by the temperature measuring unit 15, by referring to the correlation data 73 recorded in the correlation data storage unit 71, for coating the wafer 200 with the resin 302 to the predetermined resin thickness 312.

According to the first embodiment, as illustrated in FIG. 5, the temperature measuring unit 15 includes a thermocouple 15-1 mounted in a hole defined in the frame 20-3 and directed toward the holding surface 20-1 of the attracting member 20-2 of the holder 20, and a radiation-type thermometer 15-2 disposed on a side of the holder 20 and directed toward the holding surface 31 of the table 30. According to the first embodiment, the thermocouple 15-1 measures the temperature of the holder 20 in the processing chamber 10, and the radiation-type thermometer 15-2 measures the temperature of the table 30. According to the present invention, however, the temperature measuring unit 15 is not limited to the above configuration according to the first embodiment, but may be of any configuration as long as it is capable of measuring the temperature in the processing chamber 10. The temperature measuring unit 15 should preferably measure the temperatures of at least either one of the holder 20 and the table 30 directly involved in coating the wafer 200 with the liquid resin 301, and should more preferably measure the temperatures of both the holder 20 and the table 30.

The resin applying machine 1 according to the first embodiment needs to conduct a predetermined experiment in order to record the correlation data 73 beforehand in the correlation data storage unit 71. Specifically, the predetermined experiment is conducted to measure the resin thickness 312 of the resin 302 applied to the wafer 200 when the moving unit 50 has relatively moved the holder 20 and the table 30 over the same moved distance 27 at different temperatures in the processing chamber 10. Stated otherwise, it is possible according to the predetermined experiment to acquire a correlation between the temperature in the processing chamber 10 and the resin thickness 312 of the resin 302 applied to the wafer 200 when the moved distance 27 by which the moving unit 50 has relatively moved the holder 20 and the table 30 is constant. More specifically, correlation data 72 illustrated in FIG. 6, for example, can be acquired by performing a fitting process on the result of the experiment with a predetermined smooth approximate function.

In the predetermined experiment to be conducted beforehand by the resin applying machine 1 according to the first embodiment, it is preferable to employ an arithmetic mean of the temperature of the holder 20 measured by the thermocouple 15-1 and the temperature of the table 30 measured by the radiation-type thermometer 15-2, as the temperature in the processing chamber 10. In such a case, the temperature in the processing chamber 10 can be handled as an appropriate representative value. According to the present invention, the temperature in the processing chamber 10 that is used in the predetermined experiment conducted in advance by the resin applying machine 1 is not limited to the arithmetic mean referred to above, but may be the temperature of the holder 20 measured by the thermocouple 15-1 or the temperature of the table 30 measured by the radiation-type thermometer 15-2, or a temperature in the processing chamber 10 that is measured in another location or by another process.

Taking into account the fact that the bumps 204 are embedded in the liquid resin 301 as illustrated in FIG. 5 when the liquid resin 301 is deformed in the resin applying operation, the wafer 200 that has the thickness 210, the liquid resin 301 to be applied to the desired resin thickness 311, and the sheet 92 that has the known thickness 97 are vertically layered between the holding surface 20-1 of the holder 20 and the holding surface 31 of the table 30. In view of this, the predetermined experiment to be conducted beforehand by the resin applying machine 1 according to the first embodiment is carried out taking into consideration the thickness 97 of the sheet 92 and the thickness 210 of the wafer 200 illustrated in FIG. 5, and corrections are made as by subtracting these thicknesses. Moreover, the predetermined experiment is conducted taking into consideration a shrinkage factor at which the liquid resin 301 is hardened into the resin 302 and appropriate corrections are made, similarly in a case where the appropriate amount of the liquid resin 301 to be supplied is calculated in the resin supplying operation. In the predetermined experiment, in a case where the sheet placing operation is omitted, it is not necessary to take into account the thickness 97 of the sheet 92 and to make corrections by subtracting the thickness 97 of the sheet 92.

According to the first embodiment, as illustrated in FIG. 6, the correlation data 72 is represented by a monotonously decreasing function according to which the resin thickness 312 decreases as the temperature increases within the range of the temperature in the processing chamber 10 when the resin applying machine 1 is actually used. This is considered to be caused by the fact that the thermal expansion of the components such as the holder 20, the table 30, the moving unit 50, etc. as apparatus parts in the processing chamber 10 of the resin applying machine 1 tends to reduce the spacing between the face side 201 of the wafer 200 and the upper surface of the sheet 92 in the range of the temperature, and the shrinkage factor of the liquid resin 301 and the thermal expansion of the resin 302 determine the final resin thickness 312 of the resin 302 based on the spacing. According to the first embodiment, the correlation data 72 is approximated by a linear function with respect to the temperature and the resin thickness 312 in the range of the temperature. This is considered to be because in the range of the temperature, since the thermal expansion of the components referred to above can be approximated by a linear function, the reduction of the spacing referred to above can similarly be approximated by a linear function.

The resin applying machine 1 according to the first embodiment further needs to carry out predetermined data processing based on a plurality of correlation data 72 acquired by the above predetermined experiment with respect to respective various moved distances 27. Specifically, according to the predetermined data processing, a correlation between the temperature in the processing chamber 10 and the moved distance 27 by which the moving unit 50 has relatively moved the holder 20 and the table 30 in a case where the resin thickness 312 of the applied resin 302 is of a predetermined value can be acquired on the basis of the plurality of correlation data 72, and correlation data 73 illustrated in FIG. 7, for example, can be acquired by performing predetermined computer processing. The correlation data 73 thus acquired becomes data for making the resin thickness 312 of the applied resin 302 constant even at different temperatures in the processing chamber 10. The resin applying machine 1 according to the first embodiment records the correlation data 73 thus acquired in the correlation data storage unit 71.

According to the first embodiment, inasmuch as the correlation data 72 is represented by a monotonously decreasing function according to which the resin thickness 312 decreases as the temperature increases within the range of the temperature in the processing chamber 10 when the resin applying machine 1 is actually used, the correlation data 73 is represented by a monotonously decreasing function according to which the moved distance 27 decreases as the temperature increases as illustrated in FIG. 7, as is the case with the correlation data 72. According to the first embodiment, since the correlation data 72 is approximated by a linear function with respect to the temperature and the resin thickness 312 in the range of the temperature, the correlation data 73 is represented by a linear function with respect to the temperature and the moved distance 27, as is the case with the correlation data 72.

In the resin applying operation, as illustrated in FIGS. 8A and 8B, the controller 70 controls the moving unit 50 to move the holder 20 downwardly closely to the table 30 by the moved distance 27 set by referring to the correlation data 73 recorded in the correlation data storage unit 71, causing the holding surface 20-1 of the holder 20 and the holding surface 31 of the table 30 to horizontally spread the liquid resin 301 therebetween with the wafer 200 and the sheet 92 interposed therebetween. In the resin applying operation, consequently, the liquid resin 301 to coat the face side 201 of the wafer 200 is formed between the face side 201 of the wafer 200 and the sheet 92. In the resin applying operation, since the sheet 92 is flat, the surface of the liquid resin 301 that is held in contact with the sheet 92 is formed flatwise.

The resin applying machine 1 performs a hardening operation in which the hardening unit 60 hardens the liquid resin 301 applied to the wafer 200 in the resin applying operation into the resin 302, as illustrated in FIG. 9.

In the hardening operation, according to the first embodiment, the ultraviolet ray emission sections 61 of the hardening unit 60 emit ultraviolet rays 62 through the table 30 and the sheet 92 to the liquid resin 301 that is an ultraviolet-curable resin, hardening the liquid resin 301 into the resin 302, as illustrated in FIG. 9. In the hardening operation, as the liquid resin 301 is hardened into the resin 302, the liquid resin 301 that has the resin thickness 311 is shrunk into the resin 302 that has the resin thickness 312 smaller than the resin thickness 311.

As illustrated in FIG. 10, the resin applying machine 1 performs an excess portion removing operation in which the excess portion removing unit 120 cuts off an excess portion, which protrudes radially outwardly from the outer edge of the wafer 200, of the resin 302 that has coated the face side 201 of the wafer 200.

In the excess portion removing operation, specifically, the delivery unit 86 delivers the wafer 200 whose face side 201 has been coated with the resin 302 by the processing up to the hardening operation, from the holder 20 to the excess portion removing unit 120, and places the wafer 200 on the holding table 121 with the resin 302 facing vertically downwardly.

In the excess portion removing operation, next, the excess portion removing unit 120 causes the cutter 122 to cut into the resin 302 vertically downwardly along the outer edge of the wafer 200 held on the holding table 121, as illustrated in FIG. 10. In the excess portion removing operation, thereafter, the excess portion removing unit 120 moves the cutter 122 that has cut into the resin 302 circumferentially along the outer edge of the wafer 200, cutting off the excess portion of the resin 302. In the excess portion removing operation, the cutter 122 is caused to cut into the sheet 92 beyond the resin 302, so that any excess portion of the sheet 92 can be cut off simultaneously when the excess portion of the resin 302 is cut off. Even if the resin 302 is free of any excess portion, it is preferable to carry out the excess portion removing operation in order to cut off any excess portion of the sheet 92.

The resin applying machine 1 according to the first embodiment is able to produce the wafer 200 that has been coated with the resin 302 to the desired resin thickness 312, all over the face side 201 as one of the surfaces of the wafer 200, through the processing ranging from the sheet placing operation to the excess portion removing operation described above.

In the resin applying machine 1 according to the first embodiment, which is arranged as described above, the controller 70 includes the correlation data storage unit 71 for recording the correlation data 73 with respect to the temperature in the processing chamber 10 and the moved distance 27 by which the moving unit 50 has relatively moved the holder 20 and the table 30 at the temperature, as data for making the resin thickness 312 of the applied resin 302 constant even at different temperatures in the processing chamber 10, the data being acquired on the basis of measured resin thicknesses 312 of the resin 302 that has coated the wafer 200 when the moving unit 50 has relatively moved the holder 20 and the table 30 by the same moved distance 27 at different temperatures in the processing chamber 10, sets the moved distance 27 corresponding to the temperature measured by the temperature measuring unit 15 in the moving unit 50, and coats the wafer 200 with the resin 302 to the predetermined resin thickness 312. Since the resin applying machine 1 according to the first embodiment changes the moved distance 27 set in the moving unit 50 in order to coat the wafer 200 with the resin 302 to the desired resin thickness 312 depending on the temperature in the processing chamber 10, the resin applying machine 1 is advantageous in that it can reduce thickness variations of the resin 302 that has coated the wafer 200, which variations would possibly be caused by variations of the temperature in the processing chamber 10.

According to a conventional method, in a case where the resin thickness 312 of the resin 302 to coat the wafer 200 is set to 100 μm, even when the temperature in the processing chamber 10 varies slightly by approximately 1° C. within the range of the temperature referred to above, the resin 302 that has coated the wafer 200 tends to have a thickness variation of approximately 2 μm, and its relative error reaches 2%. With the resin applying machine 1 according to the first embodiment, however, each time it performs the resin applying operation, it measures the temperature in the processing chamber 10 and optimizes the moved distance 27 to be set in the moving unit 50. Therefore, it can be seen that thickness variations of the resin 302 that has coated the wafer 200 that possibly tend to occur due to variations of the temperature in the processing chamber 10 are greatly reduced in terms of a converted relative error.

According to the process disclosed in Japanese Patent Laid-Open No. 2017-168565, in a case where the pressing force applied to the liquid resin 301 in the resin applying operation is controlled, the resin 302 that has coated the wafer 200 is likely to suffer large thickness variations due to variations of the viscosity of the liquid resin 301. The resin applying machine 1 according to the first embodiment, however, is able to essentially prevent the resin 302 that has coated the wafer 200 from suffering thickness variations that possibly tend to occur due to variations of the viscosity of the liquid resin 301 because a controlling factor in the resin applying operation is the moved distance 27 as a parameter directly acting on the resin thickness 312, instead of the pressing force.

In the resin applying machine 1 according to the first embodiment, the temperature measuring unit 15 measures the temperature of at least one of the holder 20 and the table 30. Since the resin applying machine 1 according to the first embodiment uses the temperature of the holder 20 or the table 30 close to the liquid resin 301 as the temperature in the processing chamber 10, the resin applying machine 1 can accurately grasp the thermal expansion of the components including the holder 20, the table 30, the moving unit 50, etc. and the resin 302 and optimize the moved distance 27 set in the moving unit 50. Therefore, the resin applying machine 1 is advantageous in that it can appropriately reduce thickness variations of the resin 302 that has coated the wafer 200, which thickness variations would possibly be caused by variations of the temperature in the processing chamber 10.

Furthermore, in the resin applying machine 1 according to the first embodiment, the temperature measuring unit 15 measures the temperatures of the holder 20 and the table 30 and uses their average as the temperature in the processing chamber 10. Therefore, since the resin applying machine 1 according to the first embodiment can accurately grasp the temperature of the liquid resin 301 as the temperature in the processing chamber 10 and optimize the moved distance 27 set in the moving unit 50, the resin applying machine 1 is advantageous in that it can appropriately reduce thickness variations of the resin 302 that has coated the wafer 200, which variations would possibly be caused by variations of the temperature in the processing chamber 10.

Second Embodiment

Figure 11A:
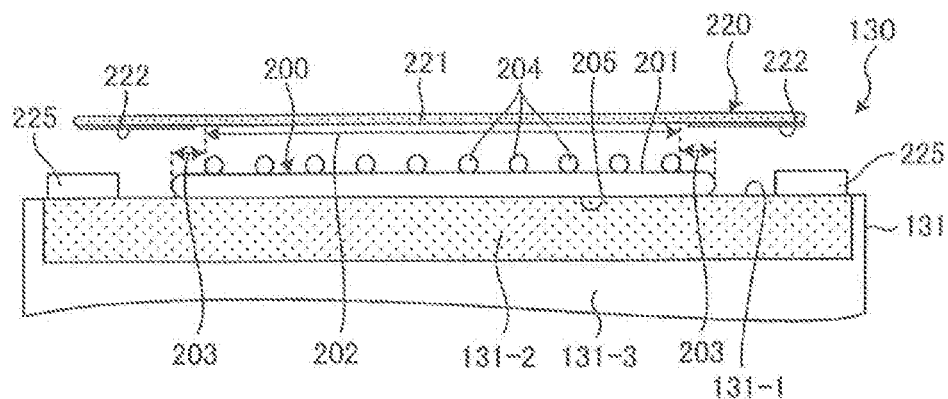
FIGS. 11A and 11B are cross-sectional views of essential details of a tape affixing operation of a resin applying machine according to a second embodiment of the present invention.
Figure 11B:
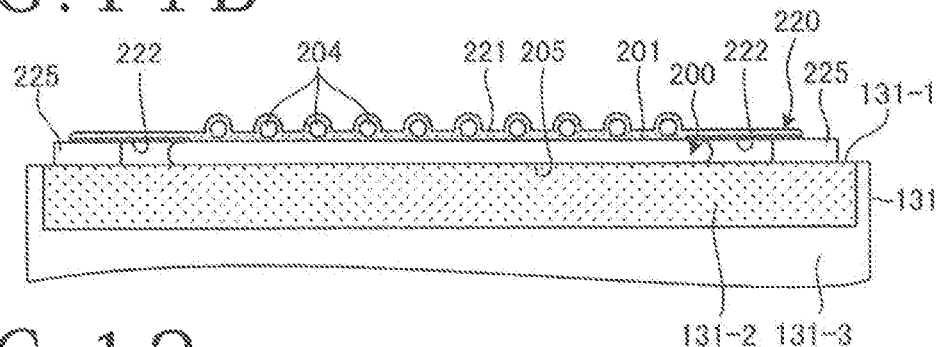
Figure 12:
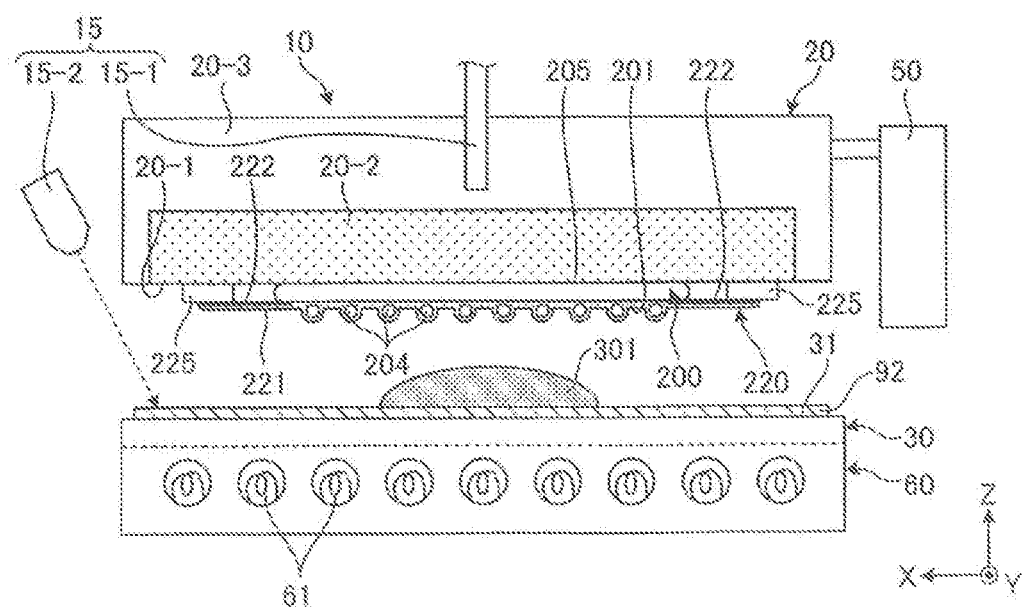
FIG. 12 is a cross-sectional view of essential details of a resin applying operation of the resin applying machine according to the second embodiment.

A resin applying machine 1 according to a second embodiment of the present invention will be described below with reference to the drawings. FIGS. 11A and 11B illustrate in cross section essential details of a tape affixing operation of the resin applying machine 1 according to the second embodiment. FIG. 11A illustrates the wafer 200 and a tape 220 before the tape 220 is affixed to the wafer 200. FIG. 11B illustrates the wafer 200 and the tape 220 after the tape 220 has been affixed to the wafer 200. FIG. 12 illustrates in cross section essential details of resin applying operation of the resin applying machine 1 according to the second embodiment. Those parts in FIGS. 11A, 11B, and 12 which are identical to those of the first embodiment are denoted by identical reference characters, and will not be described in detail below.

The resin applying machine 1 according to the second embodiment is similar to the resin applying machine 1 according to the first embodiment except that a tape affixing unit 130 is added. As illustrated in FIGS. 11A and 11B, the tape affixing unit 130 includes a holding table 131 for holding the wafer 200 as an object to which the tape 220 is to be affixed and an annular frame 225 to be mounted on an outer edge portion of the tape 220, and a tape supply unit, not illustrated, for supplying the tape 220 and affixing the tape 220 to the wafer 200 and the annular frame 225. According to the second embodiment, the tape affixing unit 130 includes the tape supply unit. However, the present invention is not limited to such details. Rather, the tape supply unit may be dispensed with, and the tape 220 may be supplied and affixed to the wafer 200 and the annular frame 225 by the operator.

As illustrated in FIGS. 11A and 11B, the holding table 131 includes an attracting member 131-2 having a flat holding surface 131-1 as its upper surface and a frame 131-3 supporting the attracting member 131-2 securely fitted in a cavity defined centrally in the frame 131-3 and opening upwardly, as is the case with the holder 20. The attracting member 131-2 is made of a material similar to that of the attracting member 20-2. The attracting member 131-2 is connected to a vacuum suction source, not illustrated, through a vacuum suction channel, not illustrated, as is the case with the attracting member 20-2. The holding surface 131-1 in its entirety holds the wafer 200 and the annular frame 225 thereon under suction forces generated by the vacuum suction source and acting through the vacuum suction channel on the holding surface 131-1.

The tape 220 used in the tape affixing unit 130 includes a tape base 221 larger than the diameter of the wafer 200 and an adhesive layer 222 disposed on a surface of the tape base 221. The tape base 221 has a central area facing the device area 202 of the wafer 200 and free of the adhesive layer 222, and an outer circumferential area including an outer edge portion that faces the outer circumferential excess area 203 of the wafer 200 and the annular frame 225, the adhesive layer 222 being disposed on the outer circumferential area.

Operation of the resin applying machine 1 according to the second embodiment will be described below. In the first embodiment, prior to the wafer holding operation, the operation of the resin applying machine 1 according to the second embodiment further performs the tape affixing operation, with resulting changes in resin applying operation.

As illustrated in FIGS. 11A and 11B, the tape affixing unit 130 of the resin applying machine 1 carries out the tape applying operation in which the tape 220 is affixed to the face side 201 of the wafer 200, which is a surface to be coated with the resin 302, and the annular frame 225 is mounted on the outer edge portion of the tape 220.

In the tape affixing operation, specifically, as illustrated in FIG. 11A, the holding table 131 of the tape affixing unit 130 holds the reverse side 205 of the wafer 200 under suction on a central area of the holding surface 131-1, and the outer circumferential area of the holding surface 131-1 holds the annular frame 225 under suction thereon. Next, in the tape affixing operation, the tape supply unit of the tape affixing unit 130 supplies the tape 220 to a position over the wafer 200 and the annular frame 225, where the central area of the tape 220 that is free of the adhesive layer 222 faces the face side 201 of the device area 202 of the wafer 200 and the surface, which faces the adhesive layer 222, of the outer circumferential area of the tape 220 with the adhesive layer 222 disposed thereon faces the face side 201 of the outer circumferential excess area 203 of the wafer 200 and the annular frame 225.

In the tape affixing operation, thereafter, as illustrated in FIG. 11B, the tape supply unit of the tape affixing unit 130 brings the central area of the tape 220 that is free of the adhesive layer 222 into intimate contact with the face side 201 of the device area 202 of the wafer 200, and affixes the outer circumferential area of the tape 220 on which the adhesive layer 222 is disposed to the face side 201 of the outer circumferential excess area 203 of the wafer 200 and the annular frame 225 with the adhesive layer 222 interposed therebetween.

In the resin applying operation according to the second embodiment, when the controller 70 sets a moved distance 27 in the moving unit 50 by referring to the correlation data 73 recorded in the correlation data storage unit 71, the controller 70 sets the moved distance 27 by which the holder 20 and the table 30 are to be moved closely to each other in a case where the thickness of the tape 220 is corrected by further subtracting the thickness of the central area of the tape 220 that is free of the adhesive layer 222 that has been brought into intimate contact with the face side 201 of the device area 202 of the wafer 200 in the tape affixing operation, i.e., the thickness of the tape base 221, from the initial spacing between the holding surface 20-1 of the holder 20 and the holding surface 31 of the table 30, in the resin applying operation according to the first embodiment.

The resin applying operation according to the second embodiment is based on the moved distance 27 by which the holder 20 and the table 30 are to be moved closely to each other in a case where the thickness of the tape 220 is corrected in the resin applying operation according to the first embodiment.

The resin applying machine 1 according to the second embodiment, which is arranged as described above, is advantageous in that it can reduce thickness variations of the resin 302 that has coated the wafer 200, which variations would otherwise be caused by variations of the temperature in the processing chamber 10, as is the case with the resin applying machine 1 according to the first embodiment. In addition, the resin applying machine 1 according to the second embodiment offers other advantages similar to that of the resin applying machine 1 according to the first embodiment.

Furthermore, inasmuch as the resin applying machine 1 according to the second embodiment carries out resin applying operation while correcting the thickness of the tape 220, the resin applying machine 1 according to the second embodiment is also advantageous in that it can reduce thickness changes of the resin 302 that has coated the wafer 200, which changes would otherwise be caused by the thermal expansion of the tape 220.

The present invention is not limited to the embodiments described above. Various changes and modifications may be made therein without departing from the scope of the invention.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A resin applying machine for coating a surface of a wafer with a resin to a desired thickness, comprising:
   a processing chamber housing therein
   a holder for holding the wafer,
   a table that faces the holder,
   a resin supply unit for supplying a liquid resin to the table,
   a moving unit for relatively moving the holder and the table closely to each other, and
   a hardening unit for hardening the liquid resin that has coated the wafer;
   a temperature measuring unit for measuring a temperature in the processing chamber, the temperature measuring unit including a first temperature measuring device that measures a temperature of holder and a second temperature measuring device that measures a temperature of the table, wherein the temperature in the processing chamber is based on the temperature measured by the first temperature measuring device and the temperature measured by the second temperature measuring device; and
   a controller configured for controlling the moving unit and the temperature measuring unit,
   wherein the controller includes a correlation data storage unit for recording therein correlation data with respect to the temperature in the processing chamber and a moved distance by which the holder and the table are relatively moved by the moving unit at the temperature, as data for making the resin thickness of the resin that has coated the wafer constant even at different temperatures in the processing chamber, the data being acquired on a basis of measured resin thicknesses of the resin that has coated the wafer when the moving unit has relatively moved the holder and the table by the same moved distance at different temperatures in the processing chamber, the controller is configured to set the moved distance corresponding to the temperature measured by the temperature measuring unit in the moving unit by referring to the correlation data and coats the wafer with the resin to a predetermined resin thickness.

2. The resin applying machine according to claim 1, wherein the temperature measuring unit measures the temperatures of the holder and the table and uses an average of the temperatures measured by the first temperature measuring device and the second temperature measuring device as the temperature in the processing chamber of the resin applying machine.

3. The resin applying machine according to claim 1, wherein the correlation data is represented by a decreasing function in which a thickness of the liquid resin decreases as the temperature increases within a range of temperatures in the processing chamber.

\* \* \* \* \*